United States Patent [19]

Jeuch

[11] Patent Number: 4,882,291
[45] Date of Patent: Nov. 21, 1989

[54] PROCESS FOR THE PRODUCTION OF ELECTRICAL ISOLATION ZONES IN A CMOS INTEGRATED CIRCUIT

[75] Inventor: Pierre Jeuch, Seyssins, France

[73] Assignee: Commissiriat A l'Energie Atomique, Paris, France

[21] Appl. No.: 249,189

[22] PCT Filed: Jan. 26, 1988

[86] PCT No.: PCT/FR88/00041
§ 371 Date: Aug. 16, 1988
§ 102(e) Date: Aug. 16, 1988

[87] PCT Pub. No.: WO88/05602
PCT Pub. Date: Jul. 28, 1988

[30] Foreign Application Priority Data

Jan. 26, 1987 [FR] France .................. 87 00861

[51] Int. Cl.$^4$ ............................................. H01L 21/76
[52] U.S. Cl. ............................................ 437/34; 437/67; 437/72; 156/644
[58] Field of Search .................... 437/61, 67, 57, 34, 437/72, 228, 245, 962, 200; 156/643, 644, 664; 357/42; 148/DIG. 103, DIG. 105

[56] References Cited

U.S. PATENT DOCUMENTS

| | | | |
|---|---|---|---|
| 4,463,493 | 8/1984 | Momose | 437/67 |
| 4,484,978 | 11/1984 | Keyser | 156/643 |
| 4,534,826 | 8/1985 | Goth et al. | 156/643 |
| 4,635,090 | 1/1987 | Tamaki et al. | 357/50 |

FOREIGN PATENT DOCUMENTS

| | | |
|---|---|---|
| 0036111 | 9/1981 | European Pat. Off. . |
| 0098775 | 1/1984 | European Pat. Off. . |
| 0111086 | 6/1984 | European Pat. Off. . |
| 0164737 | 12/1985 | European Pat. Off. . |
| 60-244037 | 12/1985 | Japan ........................... 437/61 |

OTHER PUBLICATIONS

Kudoh et al., J. Electrochem. Soc. Solid State Science and Technology (Aug. 1986), pp. 1666-1670.
Patent Abstracts of Japan, vol. 10, No. 104 (E397) [216], Apr. 19, 1986; & JP-A-60 244 043 (Toshiba K.K.) 03-12-1985.

Primary Examiner—Olik Chaudhuri
Attorney, Agent, or Firm—Oblon, Spivak, McClelland, Maier & Neustadt

[57] ABSTRACT

The CMOS circuit has n regions (12a) and p regions (28) formed in a silicon substrate (2b). First and second masks are produced on substrate (2b), respectively having first (8a) and second (15) patterns masking the p regions and n regions. These masks can be selectively etched. The first and second patterns define between them the location of the isolation trenches (18) to be produced. The substrate is etched through the masks to form the trenches and simultaneously etching takes place of the first patterns and the underlying substrate in order to form in the upper part of the trenches inclined sides in contact with the p regions, in such a way that the section of trench (18) widens towards the upper surface of the substrate.

15 Claims, 5 Drawing Sheets

PROCESS FOR THE PRODUCTION OF ELECTRICAL ISOLATION ZONES IN A CMOS INTEGRATED CIRCUIT

The present invention relates to a process for the production of electrical isolation zones in a CMOS integrated circuit.

It more particularly applies to the microelectronics field whenever it is necessary to electrically isolate from one another the n and p components of a circuit (transistors, diodes, etc.) produced on a monocrystalline silicon substrate. The invention can be more particularly used for the production of logic gates, flip-flops, random access or read-only memories, etc.

The search for a high integration density in CMOS integrated circuits requires the use of a special isolation technique between the different components of said circuits and specifically between their n channel transistors and their p channel transistors.

One of the recent isolation techniques used for this purpose is based on producing an isolating trench in the semiconductor substrate, said trench being oxidized and then filled with a material, such as polycrystalline silicon or silicon dioxide. Filling takes place by the deposition of the filling material over the entire surface of the integrated circuit, followed by the removal of the excess of said material deposited outside the trenches. Above the said trench is produced a local field oxide (LOCOS).

This technique of isolation by trench surmounted by a local field oxide has more particularly been described in an IEDM article in 1982, pp 237 to 240 and entitled "Deep Trench Isolated CMOS Devices".

This isolation technique makes it possible to achieve considerable isolation depths (several micrometers) between the different integrated circuit components, whilst ensuring a good surface isolation and whilst preventing the short-circuiting of the n channel transistors and the p channel transistors, said phenomenon being known as latch up.

Unfortunately, in such an isolation technique, the problem arises of an inversion of the electrical conductivity on the sides of the isolation trenches and therefore of the formation of parasitic channels, when the end of the channels of the transistors touch the trenches, where the transistor gates pass on to the latter. This problem of parasitic channels is more particularly described in an IEDM article in 1983, pp 23 to 26 and entitled "Characterization and Modelling of the Trench Surface Inversion Problem for the Trench Isolated CMOS Technology" by Kit M. CHAM et al. It makes it necessary to move the transistors away from the isolation trenches and more particularly the n channel transistors of said circuits, by producing a field oxide region between the trenches and the transistors at the place where the gate of said transistors passes onto the corresponding lateral isolation thereof, thus limiting the integration density of the said circuits.

Moreover, the positioning of isolation trenches between the n regions and the p regions of the substrate in which will be respectively produced the p channel transistors and the n channel transistors of the integrated circuit requires the use of several lithography masks, one mask for defining the location of the n regions and another mask for defining the location of the p regions, which are difficult to reciprocally position and which bring about a further limitation to the integration density of the CMOS circuits.

The present invention relates to a process for the production of electrical isolation zones in an integrated CMOS circuit making it possible to obviate the various disadvantages referred to hereinbefore.

In particular, the integrated circuit obtained according to the invention and using the procedure of isolating by isolation trenches, has a much higher integration density than that of the prior art CMOS circuits. Moreover, said circuit has no electrical conductivity inversion on the sides of the trenches and therefore no parasitic channels.

More specifically, the present invention relates to a process for the production of electrical isolation zones for isolating the n regions from the p regions of a CMOS integrated circuit formed in a silicon substrate, characterized in that it comprises the following stages:

(a) producing a first mask on the surface of the substrate, having first patterns masking at least partly the p regions, (b) producing a second mask on the surface of the substrate, having second patterns masking at least partly the n regions, whereby the second mask can be selectively etched with respect to the first mask, the first and second patterns being separate and defining between them the location and the width of the electrical isolation trenches to be produced between the n regions and the p regions, (c) etching the unmasked regions of the substrate for forming said trenches, (d) anisotropic etching of the substrate and simultaneous isotropic etching of the patterns of the first mask for forming, in the upper part of the trenches, inclined sides in contact with the p regions, the section of the trenches widening towards the upper surface of the substrate.

The term "substrate" is understood to mean a solid substrate or a layer epitaxied on a solid substrate.

The use of an isolation trench having asymmetrical sides in particular permits an overdoping of the sides of the trenches in contact with the p regions, thus making it possible to place the n channel transistors of the circuit in contact with the trenches and in particular the n+ active zones of said transistors. This makes it possible to significantly reduce the distance between the n and p regions and consequently increase the integration density of the circuit.

Thus, this overdoping makes it possible to avoid any electrical conductivity inversion on the sides of the isolation trenches and in particular on the side of the n channel transistors.

According to a preferred embodiment of the invention, the production process comprises the following stages:

(a') producing a mask on the upper surface of the substrate having patterns masking the n or p regions, (b') deposition on the substrate and the mask of a layer of a first material, which can be selectively etched with respect to a second material and the mask, said layer having parts overhanging the patterns of said mask, (c') deposition of a second material layer above the first material layer, (d') anisotropic etching of the second material layer until the overhanging parts of the first material layer are exposed, (e') elimination of the regions of the first material layer exposed during stage d', (f') etching the regions of the substrate exposed during the preceding stage in order to form trenches, (g') isotropic etching of the material above the p regions and anisotropic etching of the substrate to form in the upper part of the trenches inclined sides located in contact with the p regions, the section of the trenches widening towards the upper surface of the substrate, (h') filling the trenches with a filling material.

This embodiment permits an autopositioning of the lithographic masks leading to a simplification of the process, as well as to a supplementary increase in the integration density of the circuit.

Preferably, the second material is resin and the mask patterns mask the p regions of the integrated circuit.

The inventive process applies to a technology using p type recesses, n type recesses or double n and p recesses.

When using n recesses, particularly in a p type substrate, an n type ion implantation takes place between stages a' and b' for forming n regions, whilst using the mask produced during stage a'.

When using p recesses, particularly in a n type substrate, between stages g' and h' there is a p type ion implantation using the first material layer etched during stage e' of the process as the mask.

In the case of double recess technology, the two aforementioned implantations must obviously be performed.

In order to improve the planeity of the upper surface of the second resin layer, particularly in the case of large recesses, it is advantageous to produce a second lithographic mask which is complimentary to the first and which defines the dimensions and locations of the p regions.

However, said second mask, which is formed just before the deposition of the second resin layer and which is etched simultaneously with the latter during stage d does not require precise positioning, unlike in the prior art processes. Thus, the implantation mask of the p regions is constituted by what is left of the resin (second mask+resin layer) after stage d. This permits an autopositioning of the isolation trenches with respect to the p regions of the integrated circuit, which is not possible in the prior art processes.

In order to bring about diffusion of the n type ions and/or the p type ions implanted in the substrate, there is at least one thermal annealing of the structure.

The simultaneous etching of the mask of the p regions and the substrate for forming the inclined sides is more particularly described in the article published in Journal of Electrochemical Society, August 1986 and entitled "Tapered $SiO_2$ Etch in Diode-Type Reactive Ion Etching", pp 1666–1670.

Advantageously, prior to stage a, deposition takes place on the substrate of at least one protective layer, followed by the elimination of the regions of said protective layer exposed during stage e, between stages e' and f'. This etched protective layer can be more particularly used as a mask for producing a local field oxide autopositioned with respect to the isolation trenches above which it is produced.

Other features and advantages of the invention can be better gathered from the following description given in an illustrative and non-limitative manner with reference to FIGS. 1 to 8, which diagrammatically show in longitudinal section the different stages of the process for producing a CMOS integrated circuit according to the invention, whilst

The following description relates to the production of the electrical isolation zones of a CMOS circuit with double n and p recesses, produced on a p type semiconductor substrate. Obviously the inventive process has a much broader application, as has been indicated hereinbefore.

As shown in FIGS. 1 to 8, the monocrystalline silicon substrate on which the integrated circuit and its isolation zones are to be produced comprises a type p+ zone 2a having at least $10^{16}$ atoms/cm$^3$ boron ions on the basis of which a p type layer 2b has been epitaxied. In said layer 2b will subsequently be produced the n channel and p channel transistors of the circuit.

The concentration of p type impurities in the substrate, higher in depth (zone 2a) than in surface (zone 2b) makes it possible to avoid according to a known process the latch up of the n+pnp+ structure produced by the n+ sources and p+ sources of the n and p channel transistors, layer p and recess n.

Figure 1:
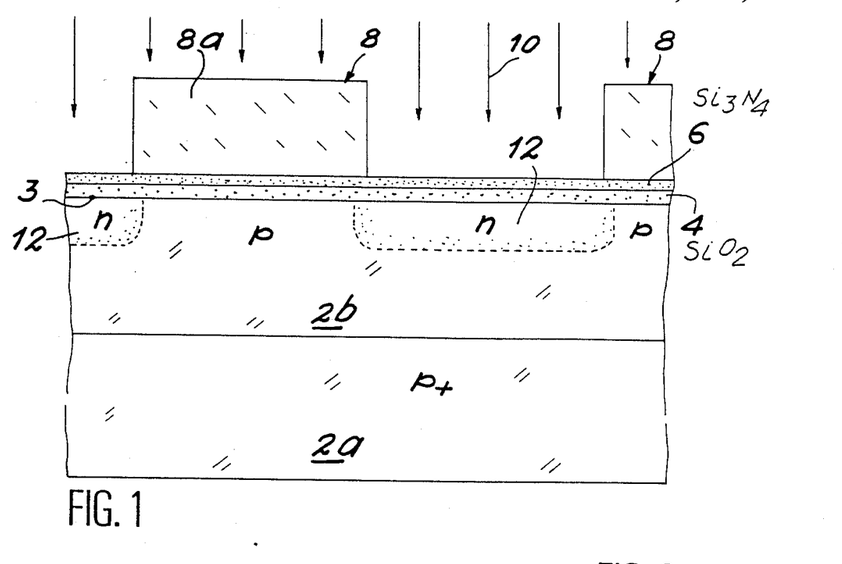

On surface 3 of layer 2b is optionally formed an isolating layer 4, which is preferably of silicon dioxide ($SiO_2$). Layer 4 can be formed by thermal oxidation of the silicon layer 2b at a temperature of approximately 900° C. The thickness of layer 4 is approximately 20 nm.

On said oxide layer 4 is then deposited another isolating layer 6, preferably of silicon nitride ($Si_3N_4$), which serves as a protective layer for the n and p recesses, as well as for locating the subsequently produced field oxide. Layer 6 has a thickness of approximately 80 nm and can be obtained by chemical vapour phase deposition (CVD or LPCVD). The silicon dioxide layer 4 serves as a support layer for silicon nitride layer 6.

The following stage of the process consists of producing a first lithography mask 8 defining the dimensions and location of the n recesses or regions in which will be subsequently produced the p channel transistors of the CMOS circuit. Mask 8 representing the image of the n regions has patterns 8a making it possible to only mask the regions of the substrate in which the p regions will be produced.

The lithography mask 8 can be a three-layer mask constituted by a first 4000 nm resin layer covered by a 150 nm $SiO_2$ layer, deposited by plasma-assisted chemical vapour phase deposition (PECVD), which is itself surmounted by a second 1200 nm novolac resin layer.

The first resin layer is made from a resin like those generally used in photolithography. Its deposition is followed by baking at 250° C. for 15 minutes, in order to bring about a good spread of said resin layer.

The patterns of the three-layer mask 8 are produced in known manner by forming in the second resin layer a mask produced by photolithography and then subjecting the stack of underlying $SiO_2$ and resin layers to reactive ionic anisotropic etching using as the etching agent $CHF_3$ and then oxygen for successively etching the $SiO_2$ layer and the first resin layer.

With the aid of mask 8 there is a first implantation 10 of n type ions with a view to forming the regions 12 or n recesses, in which will be subsequently produced the p channel transistors. Said ionic implantation can be produced with phosphorus ions at a dose of $1.10^{13}$ atoms/cm$^2$ and with an energy of 200 keV.

Figure 2:
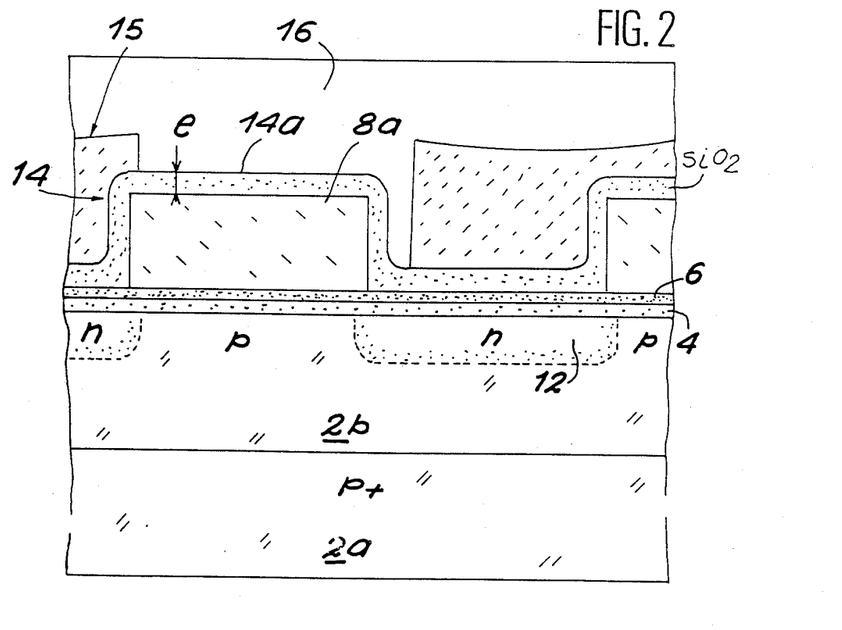

The following stage of the process and as shown in FIG. 2 comprises depositing a layer 14 of a material which can be selectively etched with respect to mask 8 and with respect to the resins generally used in photolithography.

In particular, layer 14 is of silicon dioxide ($SiO_2$) and is deposited isotropically, such as plasma-assisted chemical vapour phase deposition at a temperature of approximately 200° C. The thickness of the oxide layer 14 is approximately 500 nm. Moreover, bearing in mind the presence of the three-layer mask 8, layer 14 has overhanging portions 14a facing the p recesses. After etching, oxide layer 14 will serve as a mask for etching the isolation trenches n the substrate.

Figure 3:
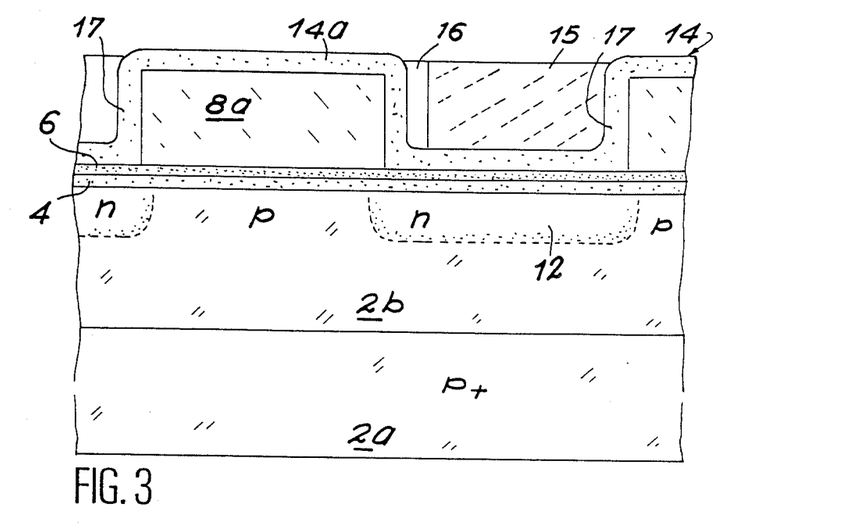

The following stage of the process consists of forming a second resin mask 15 defining the dimensions and positioning of the p recess or the regions to be produced. This second mask 15, which can be displaced with respect to the first mask 8 (cf. FIG. 2) is essentially used for filling the hollowed out portions, like 14b in the structure, in order to subsequently obtain a completely planar structure, just prior to the stage of etching the $SiO_2$ layer 14 (FIG. 3). This supply of resin to portions 14b is justified bearing in mind the possibly considerable width (approximately 300 micrometers) of the n recesses.

On the structure obtained is then deposited a resin layer 16 like that conventionally used in photolithography and having a thickness of 4000 nm. Following the deposition of layer 16 baking takes place at 250° C. for approximately 15 minutes in order to obtan a good spread of said resin layer.

This is followed by etching of the resin layer 16 and mask 15 until all the resin located above the overhanging region 14a of the oxide layer is eliminated. This etching is carried out by using an oxygen plasma. The structure obtained is shown in FIG. 3.

The thus etched resin layer 16 and resin mask 15 will subsequently constitute the p type ion implantation mask for forming the recesses of the integrated circuit.

The following stage of the process consists of etching the silicon dioxide layer 14 in order to eliminate the regions thereof not masked by the remainder of the resin layer 16 and the remainder of mask 15 and in particular the overhanging regions 14a and the isolating sides 17 of mask 8. Said etching is of the reactive ionic solid plate type using $CHF_3$ as the etching agent. The structure obtained is shown in FIG. 4.

This is followed by etching of the silicon nitride layer 6 and then the silicon dioxide layer 4 with a view to eliminating the regions of said layers exposed during the preceding stage and which are not covered by the etched resin 16 and mask 15, as well as mask 8. Reactive ionic etching is used with $CHF_3$ as the etching agent.

Figure 4:
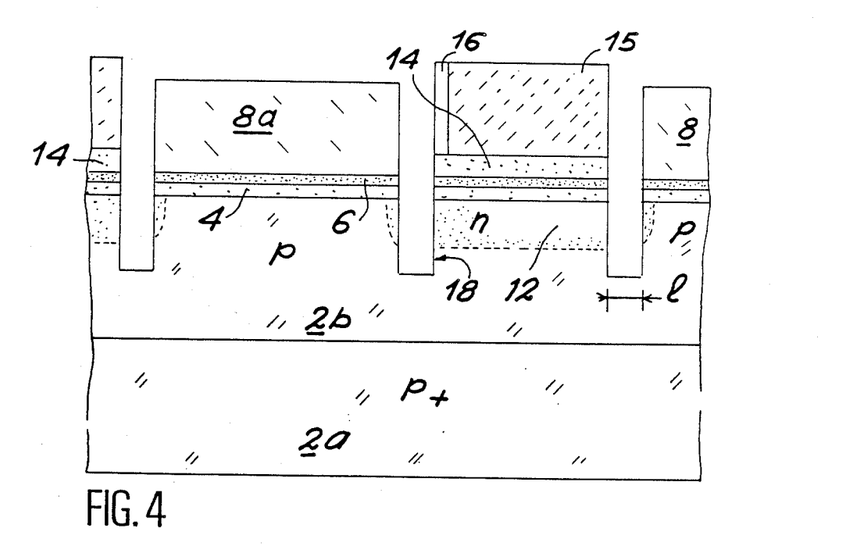

As shown in FIG. 4, this is followed by etching of the regions of the substrate exposed during the preceding stage in order to form the isolation trenches 18. The substrate is etched over a depth of approximately 5000 nm by reactive ionic etching selective with respect to the resin of layer 16 and mask 15, as well as with respect to mask 8. For this purpose, the etching agent is constituted by sulphurhexafluoride ($SF_6$).

According to the invention, the minimum width l of the trenches 18 is equal to the thickness e of the silicon dioxide layer 14 (FIG. 2), which is isotropically deposited and therefore close to 500 nm.

Thus, the inventive process makes it possible to produce submicron isolation trenches 18, unlike in the presently known trench isolation process. The obtaining of submicron trenches makes it possible to considerably increase the integration density of the integrated circuit.

Figure 5:
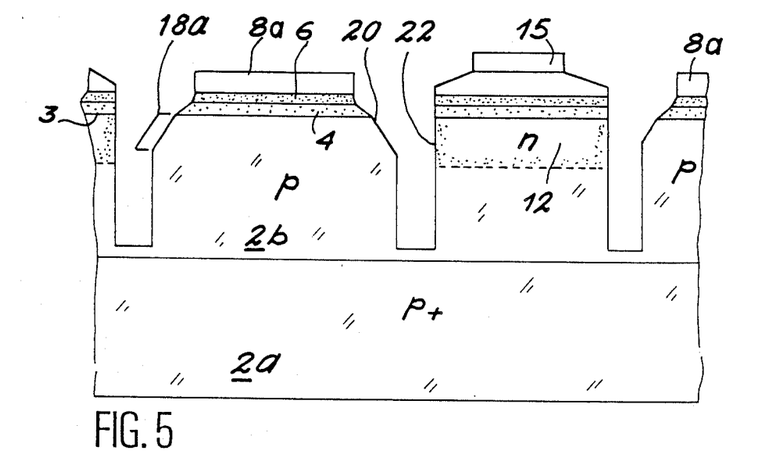

The following stage of the process consists of forming, in the manner shown in FIG. 5, asymmetrical sides in the upper part 18a of trenches 18. The sides 20 in contact with the p regions are inclined with respect to the surface 3 of the silicon layer 2b, whereas the sides 22 in contact with the n regions are perpendicular to the surface 3 of layer 2b. Sides 20 are inclined in such a way that the section of the trenches is at a maximum level with the substrate surface 3.

In order to form these inclined sides 20, anisotropic etching of layers 4 and 6 and the upper part 18a of the substrate takes place by consuming the resin 16, 15, as well as mask 18 in an isotropic manner. The etching is e.g. a reactive ionic etching using as the etching agent a mixture of oxygen and $CHF_3$, as described in the aforementioned Electrochemical document.

Figure 6:
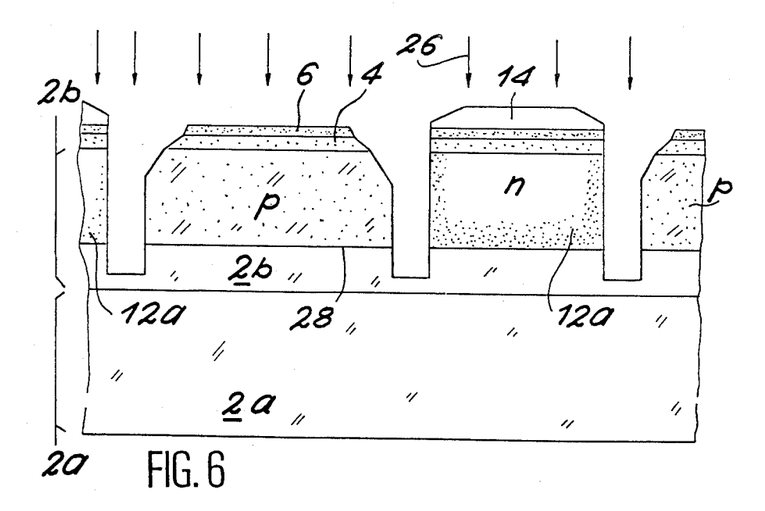

This is followed by the elimination of the remainder of the resin layer 15 and the remainder of the mask 8 not consumed during the preceding etching by dissolving in nitric acid. The structure obtained is then as shown in FIG. 6.

This is followed by an implantation of p type ions 26, in order to form the p recesses carrying the reference 28, in which will subsequently be produced the n channel transistors. Implantation 26 can be carried out with boron ions at a dose of $2.5.10^{12}$ atoms/cm$^2$ and an energy of 60 keV. This is followed by an annealing of the structure at 1175° C. for approximately 5 hours in order to bring about diffusion into the substrate and more specifically layer 2b of the implanted boron ions, as well as the previously implanted phosphorus ions. The thus diffused n recesses carry the reference 12a.

The following stage of the process consists of carrying out an overdoping of the inclined sides 20 adjacent to the p recesses 28 with a view to preventing electrical conductivity inversion on the sides of the isolation trenches 18, so as to avoid the formation of parasitic channels. This overdoping can be carried out by a $BF_2$ implantation 30 at a dose of $5.10^{13}$ atoms/cm$^2$ and an energy of 40 keV. It carries the reference 31 in FIG. 7.

Figure 7:
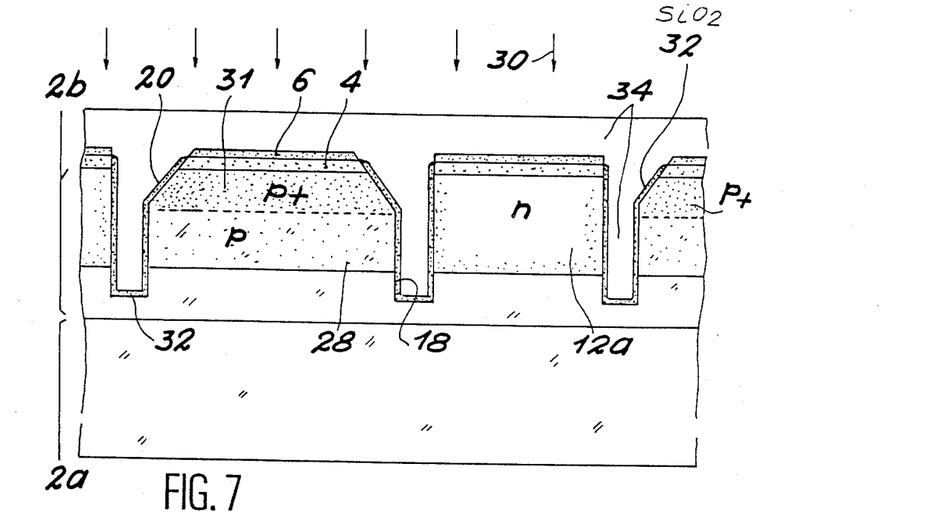

This is followed by the elimination of the remainder of the silicon dioxide layer 14 by wet chemical etching using a mixture of hydrofluoric acid and ammonium fluoride.

This is followed by thermal oxidation of the structure in an oxygen atmosphere at a temperature of approximately 900° C. This oxidation makes it possible to obtain an approximately 100 nm oxide film 32 more particularly covering the sides and bottom of the trench 18, as well as the silicon nitride layer 6. This thermal oxidation makes it possible to improve the electrical isolation by isolation trench.

This is followed by the filling of the trench with a material 34 constituted by polycrystalline silicon or a silicide (e.g. $WSi_3$). Filling takes place by isotropic deposition and in particular by chemical vapour phase deposition (CVD or LPCVD) so as to completely fill the trenches 18.

Figure 8:
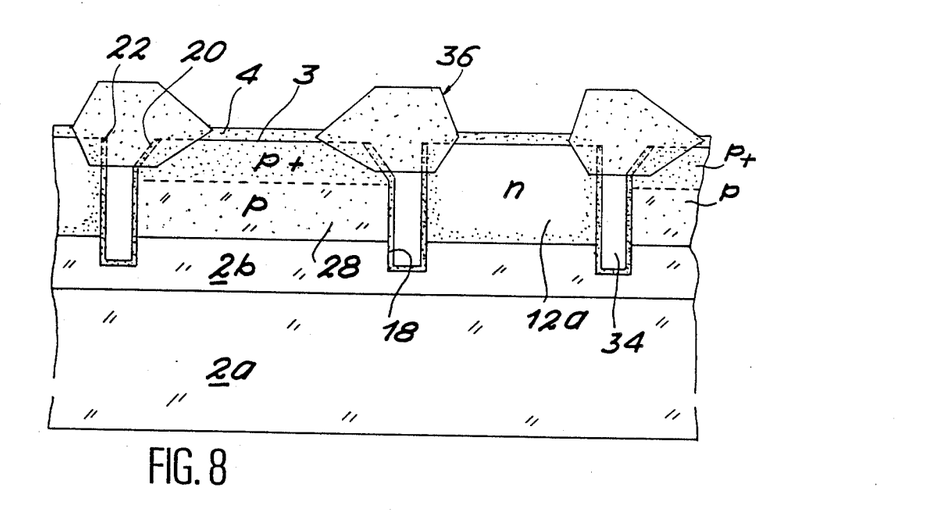

Following the filling of trenches 18, the excess of filling material located outside the trenches 18 is eliminated, so as to only leave material 34 within the trenches 18 and as shown in FIG. 8. This elimination takes place by reactive ionic solid plate dry etching using $CCl_4$ and which is selective with respect to the silicon nitride layer 6.

The local field oxide 36 is then produced in conventional manner by protecting the active regions (transistors) of the circuit to be produced, eliminating the unmasked areas of the nitride layer 6, thermally oxidizing at 900° C. the filling material 34 of the trenches, as well as the silicon substrate 2b in the regions not covered with silicon nitride, the etched silicon nitride layer 6 serving for the localization of said field oxide 36. The thickness of said oxide is approximately 600 nm.

Finally, the silicon nitride layer 6 is eliminated, e.g. by chemical etching using orthophosphoric acid. The final structure of the CMOS circuit is as shown in FIG. 8.

As a result of the inventive process, the local field oxide 36 is autopositioned with respect to the isolation trenches 18, which considerably increases the integration density of the CMOS integrated circuits.

The n channel transistors and p channel transistors of the CMOS circuit can then be produced in conventional manner respectively in the p and n recesses 28 and 12a.

Figure 9:
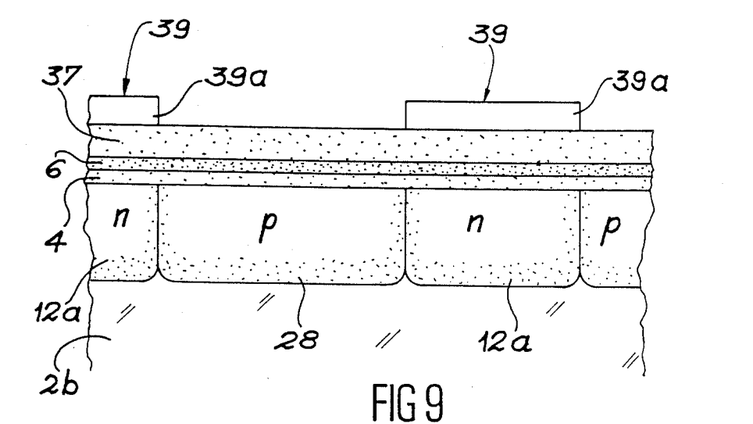
FIGS. 9 and 10 illustrate a variant of this process.
Figure 10:
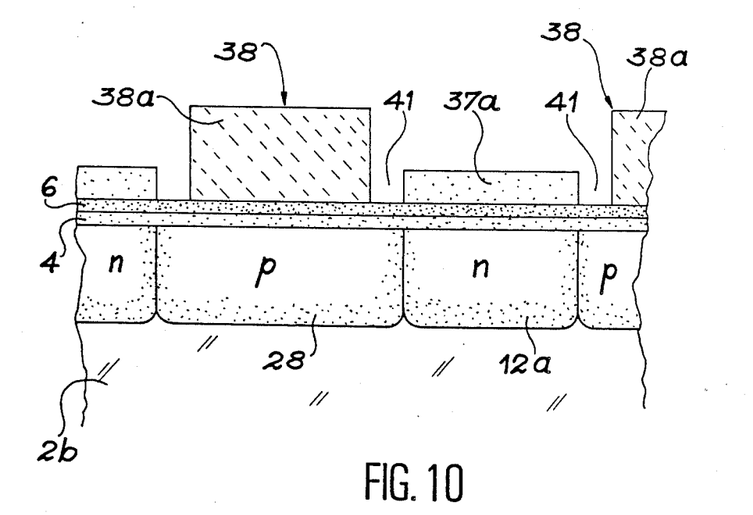

The above description has related to a realization of the invention in which the masks 8 and 15 are complimentary and autopositioned, the position of the patterns 8a of the mask 8 fixing that of the patterns of mask 15. However, it is possible to use not autopositioned masks for realizing the inventive process and this is illustrated by FIGS. 9 and 10.

After producing the n and p recesses respectively 12a and 28 in known manner by the implantation respectively of phosphorus and boron ions in the silicon substrate 2b and then implantation annealing, the silicon dioxide layer 4 and silicon nitride layer 6 are successively deposited.

This is followed by the deposition of a 0.8 micrometer thick layer 37 on layer 6 of a material resistant to silicon and resin etching and in particular of silicide, such as PtSi, CoSi₂ or SiO₂. For a SiO₂ layer 37, deposition is carried out by LPCVD (low pressure chemical vapour phase deposition).

Using conventional photolithography processes, a mask 39 is then formed and its patterns 39a mask the n recesses or regions 12a. This is followed by the elimination of the unmasked regions of layer 37, as illustrated in FIG. 9. For a SiO₂ layer 37, reactive ionic etching is used with CHF₃ as the etching agent. This gives patterns 37a masking the regions 12a.

Following the elimination of the resin mask 39 with a O₂ plasma, a second lithography mask 38 is produced and its patterns 38a partly mask the p type regions 28. Mask 38 is of the same nature as the previously used mask 8 (FIGS. 1 to 5) and fulfils the same function of the latter and is produced in the same way. The patterns 37a of the first mask and those 38a of the second mask alternate and the spaces 41 located between two patterns 37a and 38a defining the location and width of the isolation trenches to be produced.

This is followed by an etching of the regions of the substrate not covered by patterns 37a and 38a, in order to form isolation trenches, as stated hereinbefore (FIG. 4). The remainder of the process is identical to that described with reference to FIGS. 5 to 8.

What is claimed is:

1. A process for the production of electrical isolation zones for isolating the n regions from the p regions of a CMOS integrated circuit formed on a silicon substrate, comprising the steps of:
   (a) producing a first mask on the surface of the silicon substrate, said first mask having first patterns which mask at least a part of the p regions;
   (b) producing a second mask on the surface of the silicon substrate, said second mask having second patterns which mask at least a part of the n regions, steps (a) and (b) being interchangable in that either step may be performed before the other;
   (c) etching the unmasked regions of the silicon substrate so as to form electrical isolation trenches;
   (d) anisotropically etching the silicon substrate while simultaneously isotropically etching the patterns of the first mask and forming inclined sides in the upper part of the trenches so that the electrical isolation trenches become wider towards the upper surface of the silicon substrate; and
   wherein the second mask can be selectively etched with respect to the first mask, the first and second patterns being spaced apart and defining between them the location and the width of the electrical iolation trenches produced between the n regions and the p regions.

2. A process according to claim 1, wherein:
   the sides and bottom of the electrical isolation trenches are covered by an oxide film.

3. A process according the claim 1, wherein:
   the electrical isolation trenches are filled in with an isolation material consisting of a polycrystalline silicon or a silicide.

4. A process according to claim 1, wherein:
   a p-type doping of the inclined sides of the electrical isolation trenches is performed.

5. A process for the production of electrical isolation zones for isolating the n regions from the p regions of a CMOS integrated circuit formed on a silicon substrate, comprising the steps of:
   (a') producing a first mask, at a first location on the upper surface of the silicon substrate, having patterns so as to mask the p regions, and producing a second mask, at a second location on the upper surface of the silicon substrate, having patterns so as to mask the n regions;
   (b') depositing on the silicon substrate and the first mask a layer of a first material which can be selectively etched with respect to a second material layer and the first mask, the layer of the first material having parts on the patterns of the first mask;
   (c') depositing the second material layer above the first material layer;
   (d') anisotropically etching the second material layer until the parts of the layer of the first material are exposed;
   (e') etching the exposed first material until the silicon substrate surface is exposed;
   (f') etching the silicon substrate exposed during step (e') in order to form electrical isolation trenches;
   (g') isotropically etching the patterns of the first mask formed above the p regions and anisotropically etching the silicon substrate to form inclined sides in the upper part of the electrical isolation trenches, the inclined sides being in contact with the p regions, the electrical isolation trenches being wider towards the upper surface of the silicon substrate; and
   (h') filling the electrical isolation trenches with an electrically isolating material.

6. A process according to claim 5, wherein the second material layer is resin.

7. A process according to claim 5, wherein:
   an n-type ion implantation for purposes of forming the n regions takes place between steps a' and b'.

8. A process according to claim 5, wherein:

a p-type ion implantation takes place between steps g' and h' for purposes of forming the p regions.

9. A process according to claim 7 or 8, wherein:
an annealing is performed in order to diffuse the implanted ions into the silicon substrate.

10. A process according to claim 5, wherein:
resin is deposited on the layer of the first material and the resin and the second material layer are etched during step d'.

11. A process according to claim 5, wherein:
on the silicon substrate is deposited at least one protective layer prior to step a' and the regions of said at least one protective layer are exposed during step e' and eliminated between steps e' and f'.

12. A process according to claim 5, wherein:
between steps g' and h' there is a thermal oxidation of the silicon substrate leading to the formation of an oxide film on the sides and the bottom of the electrical isolation trenches.

13. A process according to claim 5, wherein:
after step h' a local field oxide is produced above the electrical isolation trenches.

14. A process according to claim 5, wherein:
the remainder of the first mask and the remainder of the second material layer are eliminated by etching between steps g' and h'.

15. A process according to claim 5, wherein:
the remainder of the first material layer is eliminated between steps g' and h'.

* * * * *